United States Patent [19]

Perkins

[11] 4,218,745
[45] Aug. 19, 1980

[54] MICROCOMPUTER ASSISTED ELECTRICAL HARNESS FABRICATION AND TESTING SYSTEM

[75] Inventor: Kelly M. Perkins, Simi Valley, Calif.

[73] Assignee: Lockheed Corporation, Burbank, Calif.

[21] Appl. No.: 940,900

[22] Filed: Sep. 11, 1978

[51] Int. Cl.² .................................................. G01R 31/02
[52] U.S. Cl. ......................................... 364/489; 29/705; 29/739; 324/66; 324/73 AT; 361/428; 364/482
[58] Field of Search ............... 364/482, 489, 488, 579, 364/580; 324/66, 67, 51, 73 R, 73 AT, 73 PC; 29/281.1, 566.3, 705, 712, 720, 739, 755, 624; 179/175.3 A; 361/428

[56] References Cited

U.S. PATENT DOCUMENTS

| | | | |
|---|---|---|---|
| 3,250,992 | 5/1966 | Cronkite et al. | 324/66 |
| 3,699,438 | 10/1972 | Webb | 324/66 |
| 3,806,800 | 4/1974 | Bove et al. | 324/66 |
| 3,842,496 | 10/1974 | Mercer | 29/755 |
| 3,891,811 | 6/1975 | Miller | 179/175.3 A |
| 3,902,026 | 8/1975 | Rogers et al. | 324/66 |
| 3,930,307 | 1/1976 | Schotthoefer et al. | 29/755 |
| 4,030,029 | 6/1977 | Cox | 324/66 |
| 4,091,325 | 5/1978 | Marcus et al. | 324/66 |
| 4,110,880 | 9/1978 | Peppler et al. | 29/705 |

Primary Examiner—Errol A. Krass
Attorney, Agent, or Firm—Frederic P. Smith

[57] ABSTRACT

A microcomputer based system which provides a fast, error-free method of electrical harness fabrication and testing. Each connector into which the harness will be wired is mounted on a receptacle containing a multiplex transponder, a plurality of which are in turn connected in parallel through a common data cable to a controlling computer. A video display is provided for interaction between the operator and the computer. As each wire is connected between the appropriate connector pins, the computer, through the common cable and multiplex transponders, measures the connection resistance. Error messages and wiring information are displayed. Each multiplex transponder comprises a plurality of analog multiplexer/demultiplexer parts for connecting a common transmit data line in the connecting ribbon cable to any predetermined connector pin, and for connecting any connector pin to the common receive line of the connecting cable to allow testing the resistance between any electrical points. As a system initialization step, the computer automatically codes each multiplex transponder with a unique address so that a plurality of otherwise identical multiplex transponders on the formboard may be identified by the computer.

20 Claims, 17 Drawing Figures

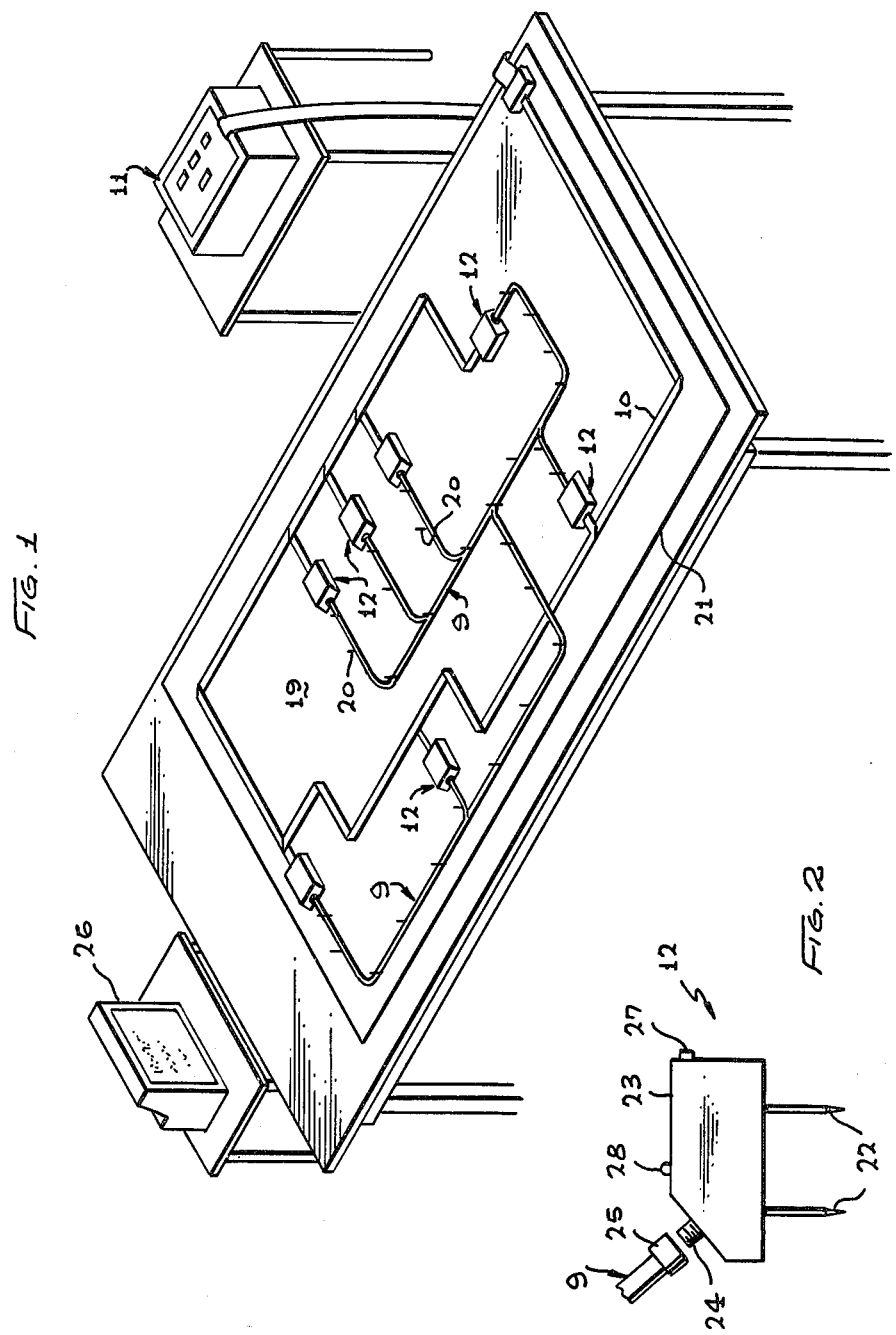

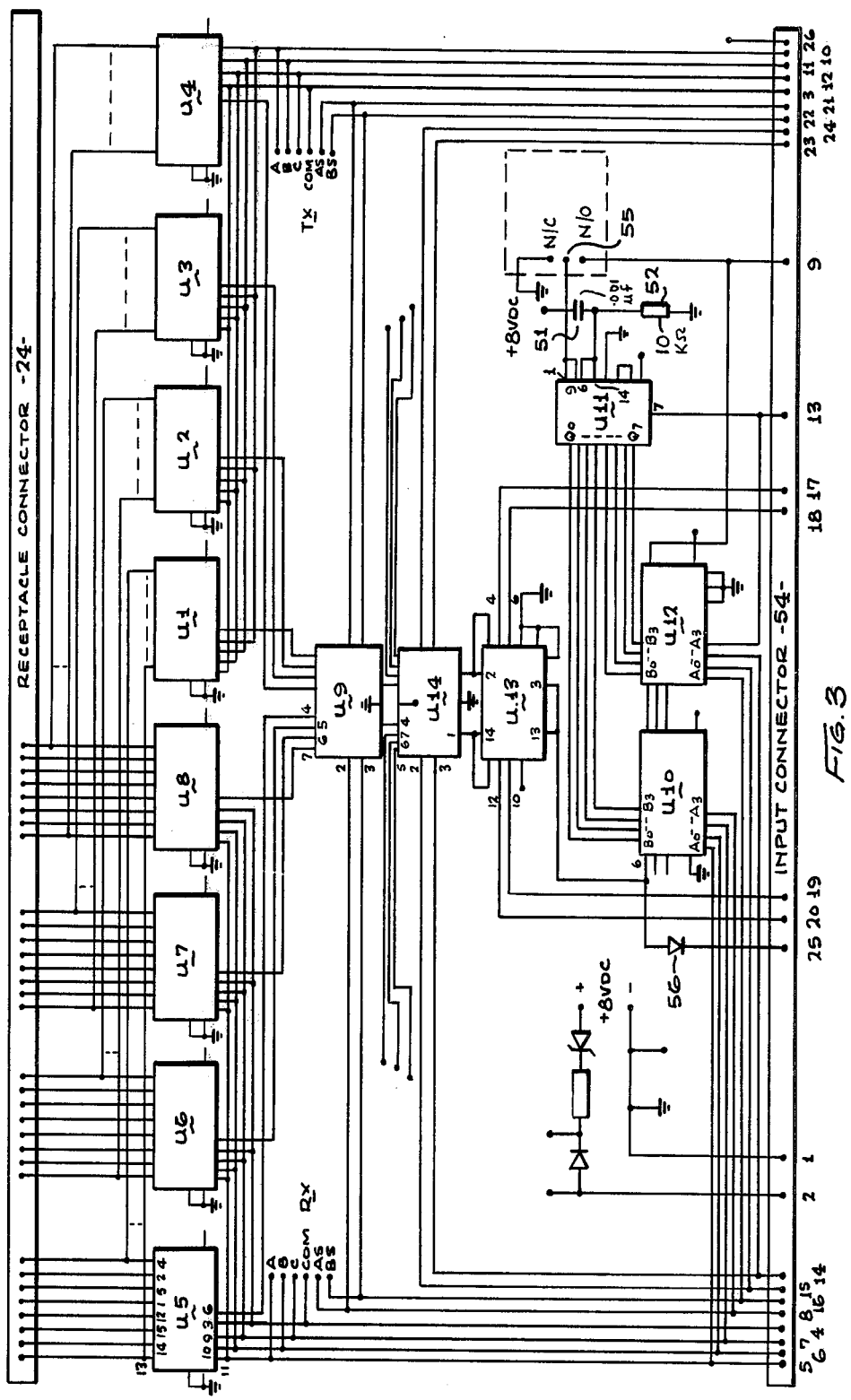

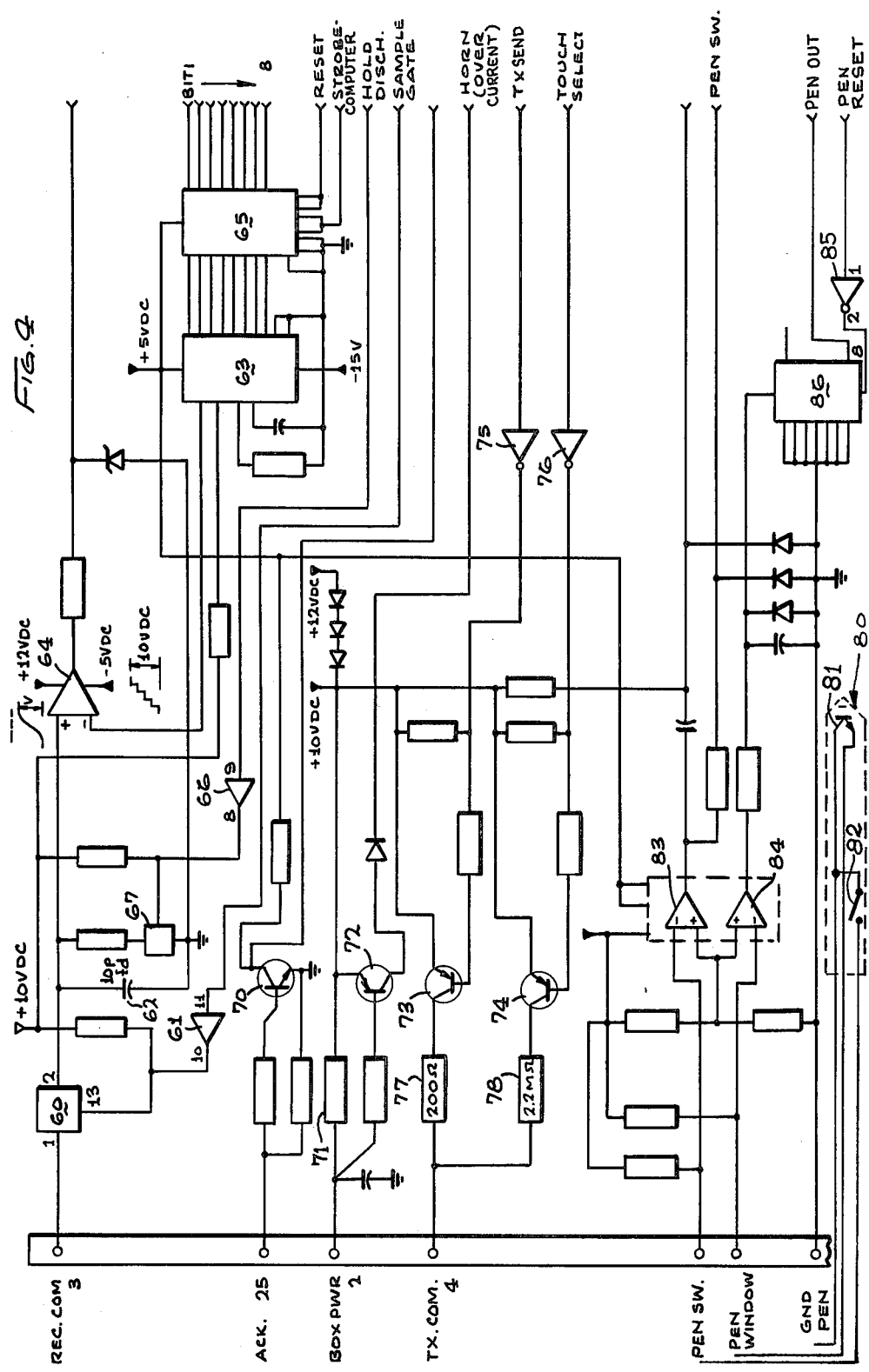

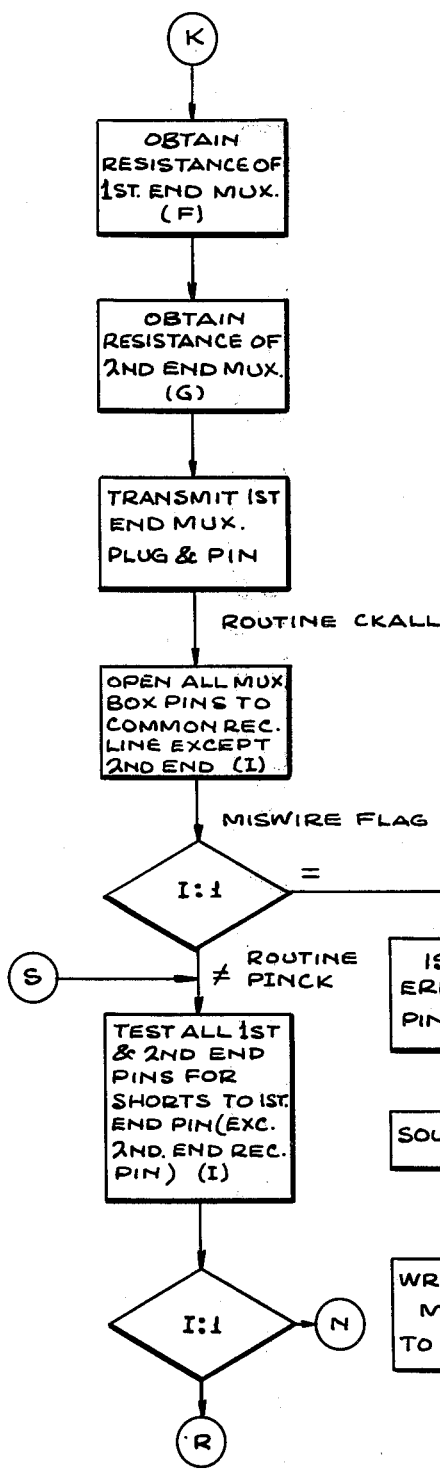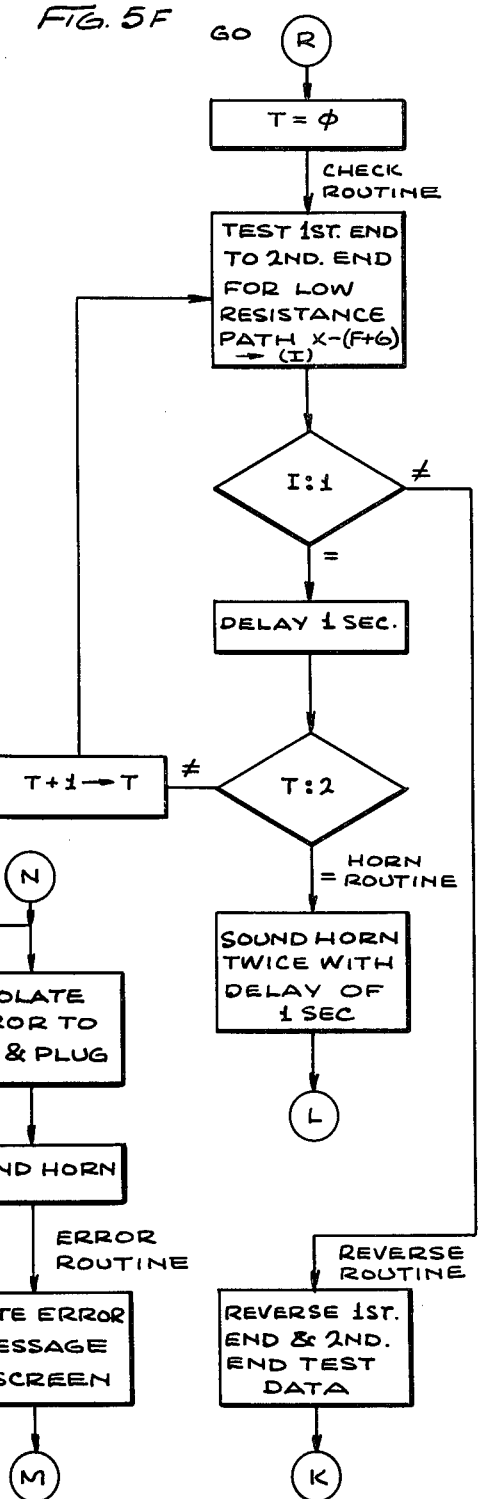
FIG. 5E
FIG. 5F

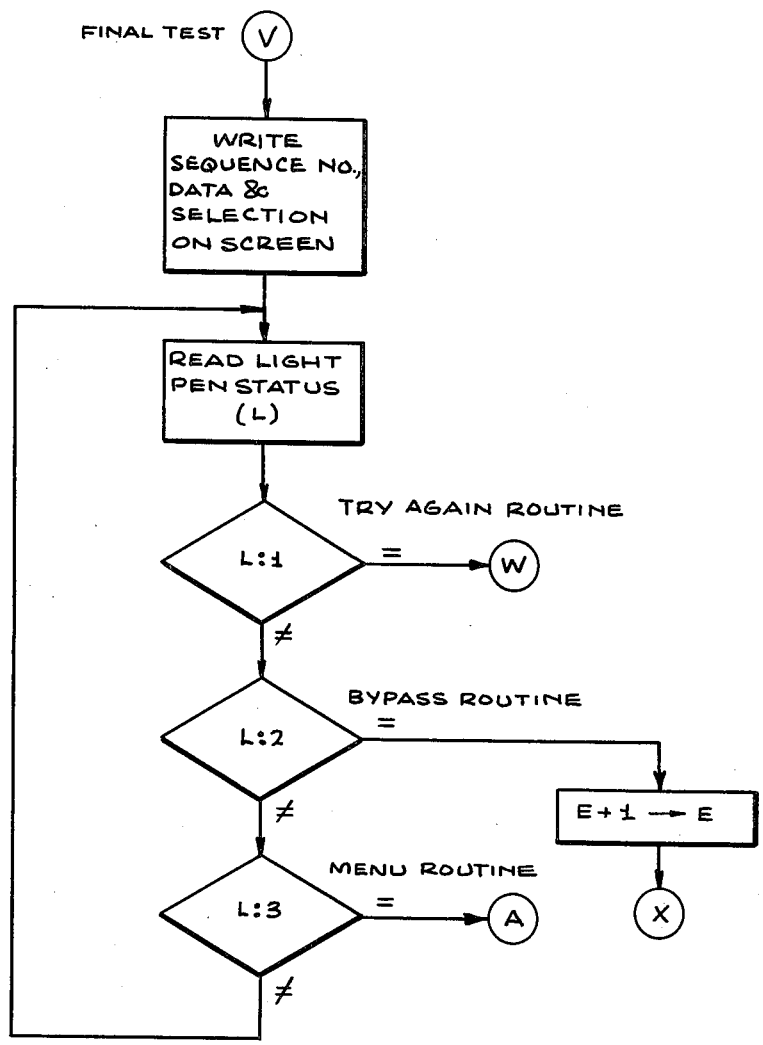

MICROCOMPUTER ASSISTED ELECTRICAL HARNESS FABRICATION AND TESTING SYSTEM

TECHNICAL FIELD

The invention relates to the field of fabrication and testing of electrical wire harnesses and, in particular, to the fabrication and testing of wire harnesses, using a microcomputer.

BACKGROUND OF PRIOR ART

The requirement in the electronics industry for large numbers of complex wiring harnesses for use in electronic systems has led manufacturers to create many means of electrical harness fabrication in an effort to achieve the most cost-effective methodology. However, today's spectrum of solutions, including automated mass wiring techniques for industries that require large numbers of identical harnesses, i.e., the automobile industry, are very costly in the majority of cases where limited quantities of harnesses are required. Lacking a better solution, the electronics industry has for the most part maintained a system of fabrication based on unassisted manual wiring. This manual production method has been to assemble electrical wire harnesses on shop aides called "formboards".

One harness assembly method is known as the "cut to length" method. The actual length and type of wire to be cut is established during the initial development of the harness. Next the appropriate designation characters are hot stamped onto the wire at customer specified intervals and other wire identification such as tabs, sleevings and identifying nomenclature are attached. Identified wires are then sorted by placing them on a rack according to the first end plug to which they will later be terminated. Once the racking is completed the grouped wires are lugged or soldered into the respective connectors, called "first end" plugs, according to information provided by a wiring document. Preassembled first end plugs are then consolidated to form a harness complement and are shipped to the formboard upon schedule demand.

The harness to be assembled requires preprinted wire cards, or equivalent, to supply information on the formboard wire routing and second end termination. The formboard sequence starts by placing the first end plug on the board and manually sorting through the wire bundle to select a particular wire, routing the selected wire according to the information on the wire cards, trimming the wire to an exact length, and then terminating that wire with a lug or pin at the second end location. These events are repeated until all harness wires have been installed and then the completed assembly is inspected. This process is time-consuming when left up to the discretion of the operator, since a significant amount of time is spent in looking for the appropriate wires. A more structured method of harness manufacture is not currently available and present methods are limited to the necessity of the operator getting information from wiring documents called "wire cards".

Prior to wrapping and tie-up, the entire harness is lifted from the formboard and continuity tested by means of automatic circuit test equipment, commonly manufactured by DITMCO and others. When errors are detected the test machine reaction is to print out a series of symbolic codes representing the error location. These error codes must be deciphered, and the results along with the harness are returned to the formboard for correction. Recycling of the harness through automatic circuit test and repair occurs until the harness is error-free.

Once the wire harness has been certified as correct, it is remounted on the formboard for final assembly. Each plug receives packing to insure a certain amount of wire strain relief at the point of pin insertion. The cables are also tied with lacing to secure the loose collection of wires into tight bundles. Labels are then affixed identifying the various branches of the cable to identify wire card callouts. Final inspection follows checking for correct nomenclature, recessed pins, and general customer acceptance specifications. Thereafter the harness is shipped as a sold item ready for installation.

SUMMARY OF THE INVENTION

A microcomputer based system constructed in accordance with the present invention provides an alternative and effective aid in identification, routing, termination and test evaluation during the fabrication process. Furthermore, on-line real-time error detection eliminates costly recycling of defective harnesses between the formboard and test stations.

Industry requires a microcomputer based system to reduce the high cost of harness fabrication to provide a fast error-free method of electrical harness fabrication. Specifically, the program inherent in the present invention eliminates paper searches, includes a forced sequencing scheme, tests each wire as it is connected to its associated plug, reduces the number of required inspection points, and eliminates the need to remove the harness from a fabrication to a test station.

The system described herein comprises a plurality of multiplex transponders mounted on a formboard, a single transponder unit being able to service one or more harness connectors at each location. The multiplex transponders are connected to the formboard by any conventional means and comprise a receptacle into which the individual harness connectors may be plugged. Since the multiplex transponders and their associated receptacles are located at appropriate positions on the formboard, and since the wire paths are also clearly delineated on the formboard as well as by display, the operator may proceed to wire together the connectors using wire and methods standard to the industry.

The computer is connected to every multiplex transponder by a single ribbon cable containing common data and address lines. The multiplex transponders are clipped into this ribbon cable in parallel. One multiplex transponder for one or more harness connectors is provided on the formboard. To the extent that a plurality of connectors may be identical, the corresponding multiplex transponders units are identical. In order for the computer to differentiate between identical transponders, a preliminary auto-coding step is involved. Auto-coding is a procedure whereby the computer assigns unique addresses or identification numbers to every transponder so that, for subsequent wiring operations, all wires and transponders are uniquely identified.

The computer also is connected to a video display which may be a cathode ray tube (CRT) monitor or equivalent which issues wire preparation, wiring, error and set up instructions to the operator. Further, the display provides a graphic display of the wire termination points and pattern. The system is interactive in that the display is supplied with a light pen so that the operator may chose between various options during the progress of fabricating the harness.

After the system has been initialized the computer will direct the display to indicate the operator the first wire to be connected, by connector and pin numbers, for the first and second end. After the wire has been terminated at both ends, the computer, by means of the multiplex transponders, will determine which points have been connected, and either direct the operator to the next wire to be added to the harness in case the first wire was affixed correctly, or display an error message if the first wire was affixed incorrectly. Thereafter, the operator continues to affix wires until the harness is completed. At this point the harness has also been fully tested and therefore no separate test process or test apparatus need be provided.

During the initial set up of the formboard, a drawing showing the locations of the connectors, multiplex transponders, and wire paths is affixed to the top of the formboard and the multiplex transponders and devices for defining the wire paths are affixed through the drawing to the formboard. After a first harness is assembled, the formboard may be converted to fabricate a second and different harness by removing all of the hardware from the formboard, removing the harness drawing from the formboard, affixing to the formboard a second harness drawing, affixing onto the formboard the appropriate multiplex transponders corresponding to the harness connectors, affixing the appropriate wire path defining stanchions, and loading the computer with the data pertaining to the second harness. At this point the operator may obtain a wire bundle and connectors appropriate to the second harness and begin fabrication. Because the same formboard, multiplex transponders, ribbon cable, computer, and display are used for a diversity of harnesses, a requirement for the provision of a separate formboard for each different type of harness is eliminated.

The system comprising a computer, display, ribbon cable and multiplex transponders is also useful for testing harnesses that have already been built and installed in electronic systems or vehicles such as aircraft. In this case, a typical harness test procedure would be to remove the equipment from the electronic racks or bays, thereby exposing the harness connectors, connecting the multiplex transponders to the connectors, connecting all transponders with a common ribbon cable, and testing the harness with the same program and apparatus that was used to fabricate it initially. This is an improvement over present methods of testing cables where, as is common in the industry through the use of machines known as "DITMCO" machines, dedicated wire-for-wire interconnect cables are required to be built for each harness connector, the sum of these cables being brought back to a central test site for analysis. One major difference between prior art systems and the system described in this specification is that in the present system the multiplex transponders are connected with a single ribbon cable to the central computing apparatus, whereas in prior art systems a separate cable must be supplied from each connector to the central computer.

It is thus an object of this invention to provide novel and improved apparatus for the fabrication and testing of a harness at a single location.

It is a further object of this invention to provide apparatus for enabling testing of the harness to be performed on a wire-by-wire basis as each wire is connected into the harness.

It is a further object of this invention to provide electrical means in the form of multiplex transponders for communicating between a plurality of connectors of the harness and a single ribbon cable connecting the plurality of multiplex transponders to the computer.

It is a further object of the invention to provide a novel and improved portable, simple system for the testing of harnesses in place in electronic equipment.

BRIEF DESCRIPTION OF THE DRAWINGS

FIG. 1 is an overall perspective view of a microcomputer harness fabrication and testing system embodying the present invention.

FIG. 2 is a simplified side elevation view of a multiplex transponder.

FIG. 3 is a schematic diagram of the multiplex transponder circuit.

FIG. 4 is a schematic diagram of the interface circuits.

FIGS. 5A through 5M comprise a flow chart of the computer program used in the described embodiment.

DETAILED DESCRIPTION OF THE PREFERRED EMBODIMENT

Figure 5A:
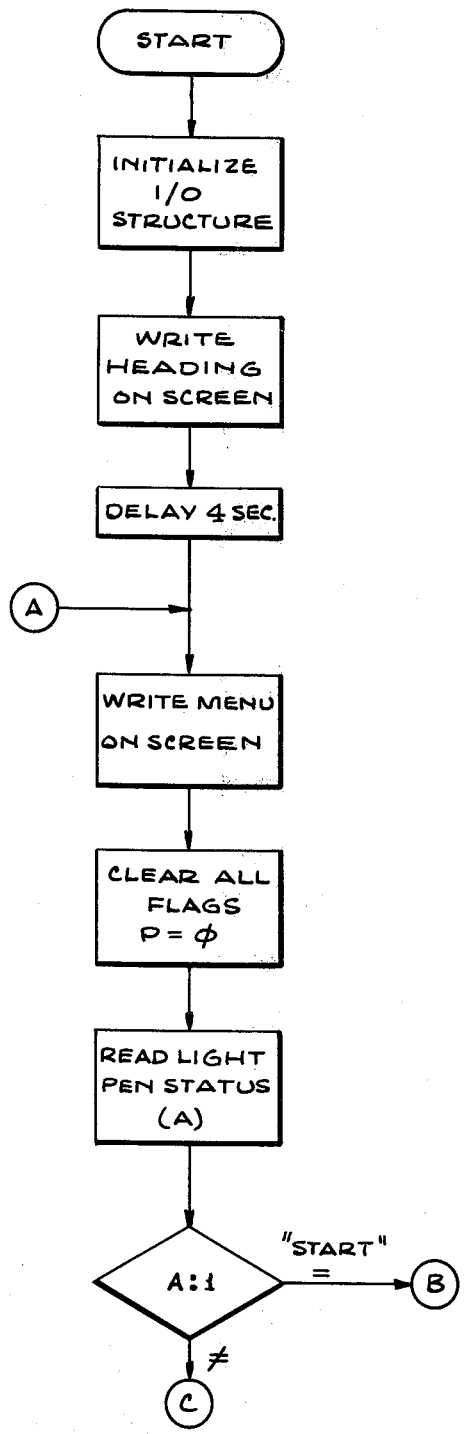

FIG. 1 is a perspective view of a typical embodiment of the system, showing a ribbon cable 10 connecting a computer 11 to a plurality of multiplex transponders 12. The ribbon cable 10 in the described embodiment contains twenty-five conductors. Each transponder 12 has a mechanical apparatus for allowing the transponder 12 to clip onto and make contact with the electical conductors of the ribbon cable 10 which allows for rapid assembly of the system. The transponders 12 are positioned on the formboard 19 according to a blueprint 21 which is placed over the formboard 19 and which indicates not only the positions of the transponders 12 but also the positions of the stanchions 20 which hold the wires of the harness 9 in their appropriate paths. These stanchions 20 are shown as posts in this figure but any alternative wire restraining device could be used. The positions of the tranponders 12 and the wires of the harness 9 are shown on the blueprint or drawing 21. The assembly procedure, therefore, is to attach a blueprint 21 onto the top surface of the formboard 19, to affix the transponders 12 at their appropriate points on the blueprint 21, to connect the ribbon cable 10 between all of the transponders 12, and to affix the stanchions 20 in their appropriate places.

Each multiplex transponder 12 is housed within a housing 23 as shown in FIG. 2 containing on its underside two nails 22 so that the transponders 12 are installed on the formboard 19 simply by pushing the nails 22 through the blueprint 21 and into the surface of the formboard 19. FIG. 2 is a simplified view of one multiplex transponder 12. The nails 22 are mounted on the tranponder housing 23. The electronic circuits are housed within the housing 23 and are connected to a receptacle 24 which mates with one of the harness connectors 25, the wire harness 9 containing a plurality of connectors 25. To the extent that a plurality of different kinds of connectors 25 are used, there must be an equivalent number of multiplex transponders 12 containing the matching receptacles 24. Likewise, to the extent that there is a plurality of identical connectors 25 in the harness, a plurality of identical multiplex transponders 12 can be used. A push button 27 is also supplied on each transponder 12 to allow operation of the auto-coding process, which occurs as follows.

When power to the system is initially turned on, a reset pulse will be generated resetting all of the multiplex transponder internal circuits to their reset condition and a coding address of zero. Thereafter, each transponder 12 is auto-coded by the operator pushing the push button 27 of each multiplex transponder 12 in turn. The push button 27 connects to an internal switch which operates through the transponder circuits and through the ribbon cable 10 to allow the computer 11 to load an address, from 1 to 225, into the transponder 12 having the depressed switch. In the described embodiment, when the address loading process for a particular transponder 12 has been completed, a tone will be emitted by the computer 11 signifying to the operator that the push button 27 on the next multiplex transponder 12 may be depressed. Ultimately, the operator will have depressed the push button 27 on each of the transponders 12 and the computer 11 will have assigned and loaded into each transponder 12 its unique address. Thereafter, as the wires of the harness 9 are connected by connectors 25 to receptacles 24, the transponders 12, in combination with the computer 11, will be able to determine the status of the harness fabrication process on a wire-by-wire basis.

A visual indication is provided to the operator for interactively controlling this system. The visual display 26 used in the described embodiment is a CRT monitor which displays to the operator a variety of information including the wire number of the next wire to be connected, its first end, its second end, and, after installation, whether the wire had been installed properly. This display 26 is also interactive in that, through the use of a light pen, not shown, the operator can select between program options that are displayed on the CRT monitor. The most common option to be displayed is the simple sequential display of the wires as they are to be wired into the harness 9. Once the first wire is correctly installed, the display 26 will show the number and the end terminations of the next wire to be installed.

Should an error be made, the display 26 will indicate to the operator the beginning and end points of the wire as actually wired, the beginning and end points of the wire as it should have been wired, the wire number, and any other information of interest to the operator. In addition, a further visual error indication occurs at the actual errored termination point as indicated by a light emitting diode 28 affixed to the appropriate multiplex transponder 12.

Another option the operator can select is the "old" option. In the case where an operator has left the harness fabrication station before the harness 9 is completed, provision is made for the computer 11, upon the operator's return, to test the wires of the harness 9 in the sequence in which they should have been installed and to automatically stop at an indication of the next wire to be wired into the harness 9 if the previous connections are all proper.

FIG. 3 is a schematic diagram of a multiplex transponder. The purpose of this circuit is to allow computer access to electrical connections within the harness connectors and to obtain a measurement from those interconnections as to their electrical resistance. This is accomplished by transmitting digital pulses through a first set of multiplexing units, receiving those pulses through a second set of multiplexing units, and comparing the transmitted and received pulses to determine the electrical characteristics of the circuit comprising the harness connectors and the intervening wiring. This transponder is a part of a larger system which obtains the resistance value of each harness connection. An additional characteristic of this system is that the individual multiplex transponders are auto-coded. That is, a plurality of identical multiplex transponders may be used in a system, wherein the computer assigns individual addresses to the transponders prior to actual wiring and testing of the harness. In this way, a set containing several identical transponders can be used to transmit, receive, or transceive electrical signals as required by the system.

The input connector 54 which connects the ribbon cable to the multiplex transponder is shown at the bottom of FIG. 3 and defines, by functional title as well as pin number, the twenty-five connections between the multiplex transponder and the common system data bus. The electrical signals from the computer are received at the multiplex transponder shift register U11 from pins 9 and 13 of input connector 54 to accomplish the auto-coding as follows. When power is first applied, an 8-volt DC level will be coupled through capacitor 51 to eight-bit shift register U11. This shift register U11 may comprise a 4015 type shift register made by RCA, Motorola, and others. Capacitor 51 and resistor 52, all resistors in FIGS. 3 and 4 being represented by open rectangles, generate a positive pulse at pins 6 and 14 of shift register U11, resetting all individual flip-flops. This circuit is thus reset at the time that power is first applied and corresponds to an address of zero.

To auto-code the particular multiplex transponder after the power is turned on, pulses are applied at input connector 54, pins 13 and 9. The input at pin 13 is a series of data pulses representing the address of this particular multiplex transponder and the inputs at pin 9 are clock pulses to clock this data into the shift register U11. The data pulses input to the shaft register at pin 7 and the clock pulses simultaneously applied at pins 1 and 9 result in the outputs Q0 through Q7 being set to a particular multiplex transponder address code number which is used to differentiate among the plurality of multiplex transponders being used simultaneously by the system.

Push button switch 55, which is mounted separately from the remainder of this circuit on the multiplex transponder housing, when depressed, couples the clock pulses to the clock inputs 1 and 9 of shift register U11. While this switch is depressed, the address pulses can be clocked into device U11 on pin 7. Using this system, a particular multiplex transponder in a group of multiplex transponders can therefore be coded to a particular address. This is to say, the input connector at all times is connected in parallel with every multiplex transponder and delivers address and clock decode pulses to every multiplex transponder, but only the multiplex transponder with the closed switch 55 will actually receive and store the address.

The outputs at Q0 and Q7 of shift register U11 are coupled to the B0 and B3 inputs of U10 and U12 type 4063 four bit magnitude comparators. Simultaneously, the address gated serially into device U11 at pin 7 will be applied in parallel to input pins A0 through A3 of devices U10 and U12. Address bits 1 through 7 are supplied at input connector 54 pins 13, 14, 15, 16, 8, 7, 6 and 5. In this way the eight-bit address in shift register U11 may be compared against the eight address bits received from the computer.

If, in fact, the shift register U11 is programmed properly there will be a bit-by-bit equality at the inputs of comparators U10 and U12 resulting in an "A=B" signal output at pin 6 of device U10. This signal will be sensed through diode 56 to pin 25 of the input connector 54 which is coupled to the computer as an acknowledge signal, signifying to the computer that shift register U11 was loaded properly with the intended address.

Because the capacity of this comparator U10, U12 is limited to eight bits, the system is limited to 255 multiplex transponders but can be expanded with additional comparators. When the acknowledge signal has been received by the computer, the computer will automatically discontinue attempts to load the address into shift register U11 and an audio and visual indication will be given to the operator to proceed to the next multiplex transponder on the formboard. In the described embodiment this notice to the operator is given in the form of an audio tone. Using this system, contact bounce at the switch 55 is not important since the computer will continue to attempt to load device U11 until it is loaded properly, at which point no further loading attempts will be made. Therefore, a switch bounce suppression means, either hardware or software, is not necessary.

The computer, with the aid of the operator, will continue to number the multiplex transponders in sequential order until all multiplex transponders have been identified with a unique address.

After the auto-coding operation is completed, the system may be used to test individual connections through the harness being built from one connector to another, each connector being mounted on a multiplex transponder receptacle which has a one-to-one wiring corresponding to the receptacle connector 24. To specify a particular connector pin, the computer first specifies the particular multiplex transponder on which the connector is mounted. This is done by issuing, through the ribbon cable to all input connectors 54, the address of one particular multiplex transponder. As in the acknowledge step, the output address of device U11 is compared to this issued address at devices U10 and U12 and if there is equality, the output at pin 6 of U10 is generated and coupled to the input pins 3 and 13 of device U13 which is a type 4027 dual flip-flop device. These inputs at U13, pins 3 and 13 are the clock inputs and allow the contents of either pins 10 and 12 or pins 4 and 6 to be clocked onto the output lines, pins 2 and 14. The inputs to the flip-flops U13 are coupled from the computer through input connector pins 19 and 20 or 17 and 18 driving the U13 output pin 14 if this multiplex transponder is to be used as a receiver, or U13 pin 2 if this transponder is to be used as a transmitter. More specifically, and by way of example, if the receiver set line 19 is high and, simultaneously, the address of a particular multiplex transponder is supplied to devices U10 and U12, a high output at pin 14 of flip-flop U13 will be produced.

Simultaneously with this operation, the acknowledgement pulse generated at pin 6 of device U10 is also coupled to the computer on pin 25 of the input connector 54 to acknowledge to the computer that the appropriate multiplex transponder has received the command.

The remainder of this circuit is divided into left and right halves. The left half, comprising portions of U13, U14, and U9 and devices U8, U7, U6 and U5 represent the receiver portion of the multiplex transponder while the remainder of the circuit represents the transmitter portion. As shown, these two halves are essentially identical.

The operation of the receiver half is as follows. Simultaneously with the receipt from flip-flop U13 of a receiver enabling pulse at pin 1 of dual binary one-out-of-four decoder multiplexer U14, two bits of addressing information are received at U14 pins 2 and 3 from the input connector 54 pins 14 and 15 which represent a two-bit address word. Assuming that the address is zero, the output at pin 4 will go high enabling device U9 and the remainder of the receiver circuit. As will be explained in more detail below, U9 can be used to select one of thirty-two receiver pins of receptacle connector 24. Three other addressing options at pins 2 and 3 of device U14 may be used to select the remaining three output pins of U14, pins 5, 6 and 7, which may be used to select any one of three additional equivalents of the circuit comprising U5, U6, U7, U8 and U9. These circuits are not shown because of redundancy, and in fact will not be used except in cases where the connector mounted on the multiplex transponder has more than 32 pins. In any case, the three additional circuits are identical to the circuits as shown and described as the left half of device U9 and devices U5, U6, U7 and U8. Therefore, the remaining discussion will use the indicated schematic diagram for a description of the multiplex transponder.

The next operation is to select one pin out of the thirty-two pins connected to devices U5 through U8. The choice is narrowed down to one of eight pins by supplying a two-bit address at pins 2 and 3 of device U9, said two-bit address being supplied at pins 8 and 16 of input connector 54, resulting in an output at either pin 4, 5, 6 or 7 of type 4556 decoder U9.

The final selection is a selection of one of eight pins controlled by the particular multiplex device, U5, U6, U7 or U8, which had been selected by one of four output lines of U9 pins 4, 5, 6 and 7. This selection is made through the signals supplied to the input connector 54 at pins 5, 6 and 7 which constitute a three-bit address to determine one of eight input pins of the selected type 4051 multiplexer demultiplexer devices U5 through U8. The three address lines are coupled to multiplexer U5 through U8 pins 9, 10 and 11 and couple one of the eight input/output lines at pins 13, 14, 15, 12, 1, 5, 2 and 4 to the common data line at pin 3 of the multiplexer U5 through U8, and thereafter to pin 7 of input connector 54. Pin 3 of all devices are commonly coupled to the receiver common line on pin 4 of the input connector 54.

The overall operation of the receiver portion of the multiplex transponder therefore is to select one of eight inputs at one of four multiplexer/demultiplexer devices U5 through U8 on one of four multiplexer boards to be coupled to the receiver common line input connector 54 pin 4 which ultimately is coupled to the computer for analysis.

The operation of the transmitter portion of the multiplex transponder is similar in that the right half of the dual binary one-out-of-four decoder multiplexer U14 selects one of four multiplexer circuit boards, decoder U9 selects one of four multiplexer/demultiplexer devices U1 through U4, and the three address lines at pins 10, 11 and 12 of input connector 54 select one of eight lines of the selected multiplexer/demultiplexer devices U1 through U4 for transmission of data on the transmitter common line pin 3 of input connector 54 through the multiplexer/demultiplexer devices out to the appropriate connector pin.

Multiplexer/demultiplexer units U1 through U8, for high impedance sources and loads, operate to within a few hundred ohms as electrical switch contacts. Therefore, these units can be used either to receive or transmit test pulses. However, it is true that the internal resistance of the 4051 multiplexer/demultiplexers is in almost all circumstances substantially higher than the resistance of the wire and connectors to be tested, and therefore there is a need for a process by which the connector and wire resistance can be separated from the receiver and transmitter multiplexer/demultiplexer resistance. This is done by setting up four equations for solution by the computer according to the following process.

By way of example, let us assume that the first wire to be connected into the harness must be connected from pin 1 of a first connector to pin 1 of a second connector. To determine if this wire has been connected into the harness correctly, the computer will issue a pulse of known amplitude which will be coupled through the transmitter common line pin 3 of input connector 54, through the first end transmitter multiplexer, through pin 1 of the first end plug, through the harness wiring, through pin 1 of the second end connector, through the second transponder multiplexer and through the receiver common line pin 4 of input connector 54 to the computer where the voltage will be compared to its original amplitude. The difference in voltage may be used to compute the total resistance of the loop. However, the loop contains the resistance of the test equipment as well as the resistance of the harness. To compute the individual resistive components, three more measurements are taken. The first is the resistance of the loop through the first end transmitter multiplexer back into the first end receiver. The second is the resistance of the loop comprising the second end transmitter and receiver multiplexers. The final measurement is the resistance of the loop from the second end transmitter to the first end receiver. Using these four simultaneous, equations, the individual transmitter, receiver and harness resistances may be computed.

The actual sequence of operations is as follows. At the time that the monitor displays to the operator the first and second end connections of the wire to be installed in the harness, it also immediately measures the resistance between the transmitters and receivers of the first and second connector multiplex transponders. Thereafter, the system begins to monitor for possible connections between all points on all connectors that have not yet been connected. In this way, when the next wire is connected between two connector pins, the system is able to compute immediately whether the wire installed had been installed on the proper connector pins, and whether the resultant resistance value is appropriate. Furthermore, because the two calibration steps are taken immediately before the wire is installed, the calibration values are necessarily accurate. The monitoring of all connectors, as described above, is not particularly time-consuming since every identically numbered pin on all transponders may be monitored simultaneously in an open collector mode, thereby increasing the search speed by a factor of 8 over what it would have been if every harness connector pin were monitored individually. It is because of this capability of scanning every pin of every connector that this system, in comparison to prior art systems, can be used to determine immediately after the wire is connected into the harness not only whether the wire has been improperly connected, but also, if improper, to which connector pin it has been connected.

In addition to being used as an aid in the fabrication of harnesses, and being used as an aid to test harnesses that have already been affixed into electronic systems, there is a third use for the described system and that is in a fabrication situation where all first end plugs have been assembled prior to being brought to the formboard location. This method would allow the operator, instead of proceeding along a forced sequence wiring list, to pick a wire from the first end plug at random and identify it to the computer by grounding it, either by touching it to a ground stud or simply by touching it with a finger. The computer could then make a search of all pins on the first end plug to determine the particular wire that the operator was holding by transmitting a pulse sequentially from each pin of the transmitter multiplexers to each corresponding pin of the receiver multiplexers. The grounded wire would be the only one to show a decreased amplitude and the monitor could then indicate to the operator the wire number and its appropriate destination or second end pin number. In this way, the time required for the operator to use a wire list to determine the next wire to be fastened into the harness can be minimized.

Another use of this system is to take resistance measurements of electronic equipment to determine its operation readiness. It is common in the testing of electronic components to make resistance measurements from various input and output pins or test points. This system could be used to automate this process by testing the resistance within the installed equipment from any pin to any other pin and comparing the value against a table of values resident within the computer. In fact, stated in its most general form, this system enables the automatic measurement and comparison to a nominal value of the resistance of any set of accessible points. The use of a computer for the comparison and logging steps would indicate that resistance measurements between large numbers of points could be taken and analyzed, and the reduced data displayed to the operator while using little real time.

Coupled with this system's inherent small size and ease of installation, this system can be used as a system for testing installed electronic harnesses and components in the field as well as aiding in the fabrication of harnesses at the factory.

FIG. 4 is a schematic diagram of the remainder of the circuits required to interface between the computer, the display unit, and the multiplex transponders.

As explained above, the test pulse, after it has been transmitted through the transponders, is coupled from the receiver common line pin 4 of the circuit of FIG. 3 to the receiver common line pin 3 of the circuit of FIG. 4. At this computer input/output circuit board the first element to receive this pulse is a type CD4016 transmission gate 60, also referred to as a bilateral switch, which is a resistive device implemented to have a low resistance value across its gates, pin 1 and 2 when pin 13 has been gated on. Therefore, when a received pulse on receiver common line pin 3 must be sampled, a sample gate pulse from the computer will be coupled to pin 11 of buffer 61 to turn on the transmission gate 60. The transmission of the leading edge of the positive test pulse through the transmission gate 60 will allow sampling capacitor 62 to begin to charge. This sampling capacitor, in the described embodiment, has a value of 10 picofarads, and therefore will charge rapidly. After a specific time interval the transmission gate 60 opens, and since the remaining resistances in the circuit are high, the capacitor 62 operates as a sample-and-hold circuit. This hold mode resistance is high partly because of the input impedance to FET operational amplifier 64 type CA3130 which is in the terraohm region. The high input impedance of the operational amplifier 64 not only allows capacitor 62 to operate in a sample-and-hold mode but also contributes very little error to the ultimate resistance determination because of its own internal input impedance. The internal resistance of the transmission gate 60 in its "off" condition is also in the area of 10 megohms. Therefore, the analog voltage being held on the common line is distorted very little because of the impedances of the circuit devices, and therefore reflects the resistance of the multiplex transponder circuit, the harness and the connectors.

In fact, the charging of sampling capacitor 62 is not allowed to build up to its final value but is interrupted a specific amount of time into its charge curve by the opening of transmission gate 60. Since the charge time of capacitor 62 is a function of the resistance on the receiver common line 3, the voltage at a calibrated time after the presentation of the pulse at receiver common line 3 is a function of the harness resistance and therefore can be used to measure that resistance.

The operational amplifier 64 compares the source voltage, the level to which the capacitor 62 has been charged, to a reference voltage produced by a digital-to-analog converter 63. The output of the operational amplifier 64 is either high or low depending upon its source voltage and reference voltages. Assuming, as an initial condition, that the reference voltage is set at zero volts and that the source voltage is positive, the output of the operational amplifier 64 will be a negative voltage, signaling to the computer that the source voltage is higher than the reference voltage. At this point the computer will transmit to device 65, comprising a type 4508 eight-bit latch, an eight bit parallel binary word which when translated by the digital-to-analog converter 63 will result in a slightly higher reference voltage at the reference input to operational amplifier 64. If the reference is still lower than the source voltage, there will be no change in the output of operational amplifier 64 and the computer will command the latch 65 and digital-to-analog converter 63 to generate a slightly higher voltage. This process will continue until the reference voltage becomes higher than the source voltage, at which point the output of operational amplifier 64 will go from low to high, signaling to the computer that the reference and source voltages are nearly equal. In this way, the computer can be used to determine the digital representation of an analog voltage by using a digital-to-analog converter 63 which is relatively more economical than a standard analog-to-digital circuit. Having determined the amplitude of the received pulse, the computer now issues a hold discharge signal which is coupled through gate 66 to a second transmission gate 67 which discharges the sample-and-hold capacitor 62. At this point the system is ready for the next pulse measurement.

Transistor 70 is an amplifier-buffer which receives the acknowledge signal from the active transponder on line 25 of the connecting cable and couples it to the computer.

The box power circuit monitors the total amount of current drawn by all of the transponders. Under overload conditions, a voltage will be generated by resistor 71 at the emitter of transistor 72 sufficient to produce a signal at its collector to generate a horn output. This is used by the computer to signify to the operator an overcurrent condition so that the operator may take corrective action. A typical current value for 32 transponders is five milliamps and, in this disclosed embodiment, the transistor 72 is set to activate the horn circuit at a current level of forty-five milliamps. The amount of current necessary to activate this circuit is variable by changing the value of resistor 71.

The calibrated pulse that is coupled out on the transmitter common line pin 4 to the transponders is produced by transistors 73 or 74 which are controlled by the computer through type 5406 gates 75 and 76. Each of these transistors 73, 74 couples a calibrated ten volts DC through precision resistors 77, 78, and therefore operates as a current generator where the current is limited by the precision resistors 77, 78, the transmitter and receiver transponders, and the harness resistance.

For testing a harness which requires the measurement of low resistance values, transistors 73 and 200-ohm resistor 77 are used. However, in the operational mode where a wire is identified by having the operator hold the second end and using this system to test for a change of resistance at the wire's first end plug connection, the system must distinguish between the relatively high resistance of the operator's hand and an open circuit presented by the undetermined wires. In this case, a much higher resistance value such as 2.2 megohm is employed for resistor 78. In effect, resistors 77 and 78 enable low and high resistance range measurements.

The resultant system of measuring resistance in a harness wire, using the charge time of capacitor 62 as a function of the total loop resistance, is relatively immune to noise and is therefore a superior method of measuring this resistance. The alternative is to allow sample-and-hold capacitor 62 to charge up to its final value before measuring it. It has been found that this final value fluctuates due to a variety of noise inputs, and also takes more time. By using the preferred technique, another variable is injected into the system; that is, variations in the elapsed time between the beginning of the pulse and the time that the transmission gate 60 is opened. A variation of this time would result in a variation of amplitude and therefore an error in the harness resistance measurement. However, this error is minimized by using a crystal controlled clock generator in the computer.

The remainder of the circuit is a typical light pen arrangement for allowing the operator to communicate with the computer. The light pen 80 comprising a photo-darlington npn transistor 81 is activated by a switch 82. The switch drives operational amplifier 83 which indicates to the computer that the light pen is switched on. Photo-darlington transistor 81 drives operational amplifier 84, the output of which is a pulse whose timing is compared to the CRT monitor timing in the computer. Specifically, a pen reset signal is applied through device 85, a type 5406 gate, to reset device 86, an 5470 flip-flop. The output of operational amplifier 84 sets flip-flop 86 resulting in a digital output at pin 8. The difference in timing between the pen reset and the pen output signals indicates the light pen position on the CRT screen, as is typical in the operation of a light pen circuit.

The following text is a description of the flow charts, FIGS. 5A through 5M, which were derived from the computer program required by the described embodiment of this invention.

As shown in FIG. 5A, the program first initializes the I/O structure, meaning the parallel input and output interface devices and including the multiplexer transponders. In doing so, it also clears the CRT screen and then presents formboard information such as the assembly number. After delaying for a period of time, it then writes a "menu" on the screen, the menu consisting of options which the operator may choose.

Figure 5B:
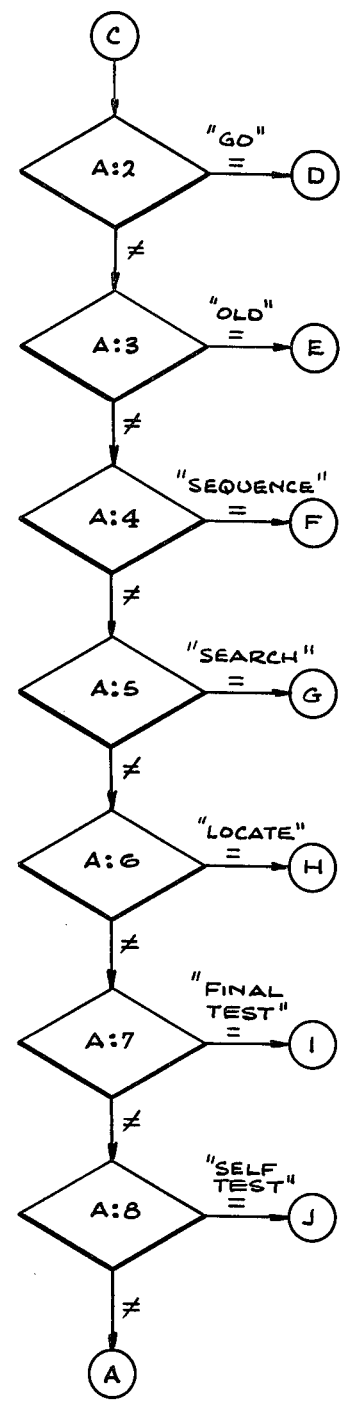

The program then reads the light pen position, indicating the selection of one option, all of which are shown in FIG. 5B. In the first instance, the logic branch which will be taken if A were equal to 1, A being the status of the light pen, would be a START branch. The other branches, as shown, are GO, OLD, SEQUENCE, SEARCH, LOCATE, FINAL TEST, and SELF-TEST. Each represents a possible branch of the program, each to an individual section which will be described below.

Figure 5C:
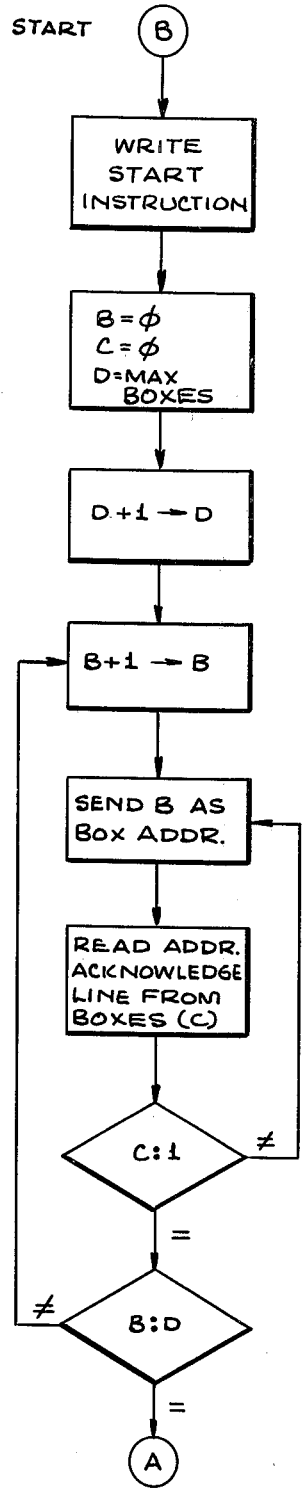
Figure 5D:
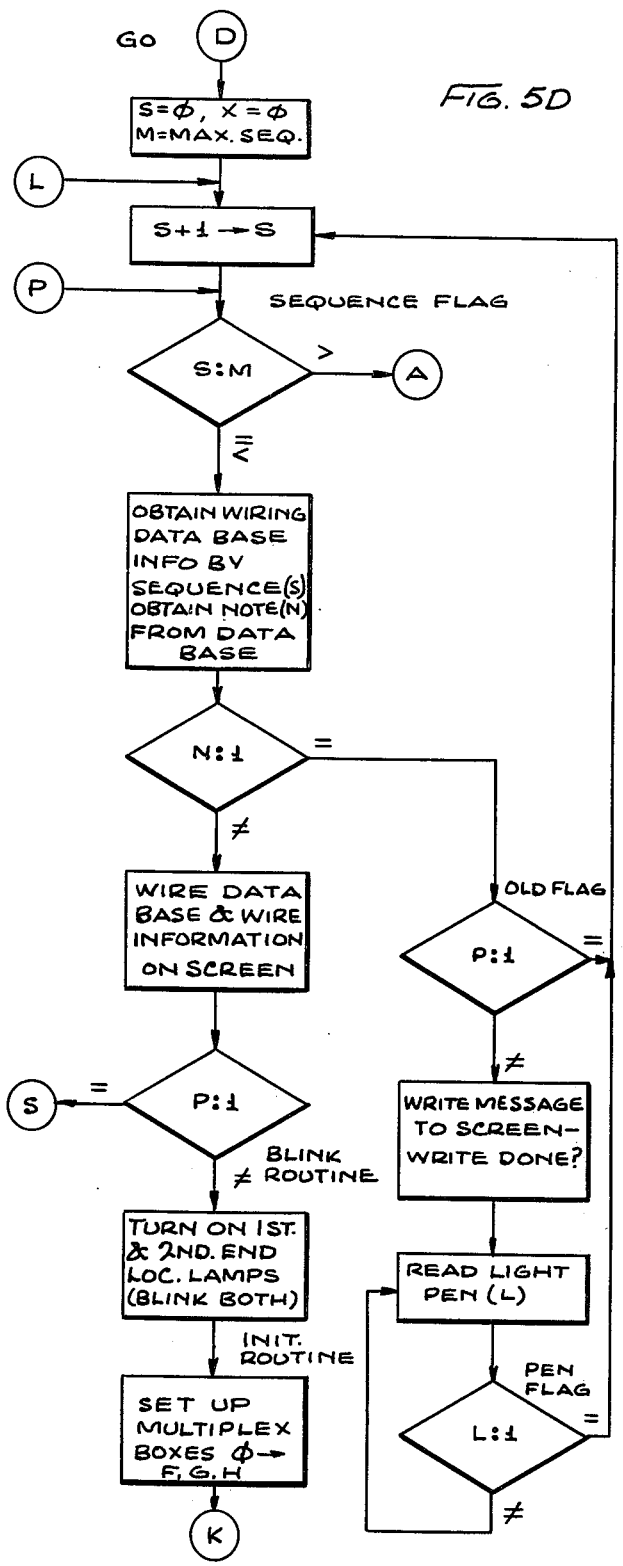

The first program section, which is shown in FIG. 5C, is the START section, an initializing section for the transponders. In every instance where a new formboard is constructed it is necessary that the transponders (hereinafter called "boxes") actually located on the formboard be located in specific positions so that the computer can associate the box with an address number. Therefore, the computer will issue an instruction to the CRT screen telling the operator how to go about placing the boxes on the formboard, will initialize several counters labeled B and C, and will access from the data base the maximum number of boxes, D, that are on the formboard.

After initialization, D and B are incremented. B, which started at 0, now becomes a value of 1, meaning the first box to be addressed by the computer. This address, B, is then sent out to all boxes by means of parallel I/O lines but only the box which has been selected by pressing the button will respond to this address on the acknowledged line with a value of C. Upon the receipt of an acknowledge signal, the program will then proceed to code the remaining boxes through a simple loop system. When B equals D, all boxes have been addressed and the program returns to the menu of FIGS. 5A and 5B.

The next program loop, GO, is the major functional routine of the program. It will find continuity or mis-wires, and it will present information of the wiring structure to the operator. The GO routine starts at connector D of FIG. 5D, where it sets, the sequence number, S, to zero, X to zero, and M equal to the maximum sequence number. The sequence number is incremented and compared to the last sequence in the flow. If the program has reached the last sequence, it will go back to menu; if not, it will fall through and continue on. If S is not equal to M, the program multiplies S by the amount of data base addresses necessary to obtain a new set of data from the wire card selection. In the standard wire card of the described embodiment there are fifty-two positions of information. Therefore, the program accesses fifty-two addresses of information and, by knowing the sequence number, multiplies to obtain the next sequenced information address of the data base to be able to make the system display that information to the operator.

There are two types of basic information that reside in the computer system. One is wire card information and the second is note information which is supplied to the operator on the CRT screen as a fabrication aid. This is signified by a note flag which is obtained along with the normal wires data base information. If the value of N signifies that the information is a note, the program will branch to a routine to display the note on the screen. If, however, a note is required by the data base but an OLD flag is set, meaning that the operator is trying to find the first open wire of the harness, it will again step by that particular sequence, returning back to the original program.

If, on the other hand, the program is not in an OLD sequence, that is, searching for the first open wire, and the program received a note, then it will write that message on the screen. Once the note is written on the screen, the operator will signify by means of the light pen that the operation is completed, in which case it will again fall through and increment the sequence by one, advancing to the next sequence to obtain the wire card information.

At his point, the program will write the data base and other information on the screen in a fixed format. Now, the OLD flag is interrogated to determine whether the program is searching for an open continuity. If not, the program will go into a blink routine which will turn on the first and second end lamps indicating where the to/from connections are on the formboard. Next, the program initializes the transponder boxes, sets up the I/O interconnections and sets the values of F, G and H to O. The program is now ready to measure the resistances of the first and second end multiplexer boxes and to determine whether there exists an electrical path between the first transmit multiplex box, plug and pin, and any other box, plug and pin.

The next two program routines, on FIG. 5E, are to check for mis-wires from the first end and second end box to any other box location, except for the first and second end box, and to check every pin within the first and second end boxes with the exception of those pins that are designated to be normal transmit and receive pins. If an error is found during this operation, the program will isolate the error, set a horn flag, and write an error message on the screen. After the error message has been written, several light pen options appear on the screen to allow the operator to go back, to bypass or to return to the menu. These selections are represented by connectors, P, L and A of FIG. 5G. Loop A would go back to the menu, L would bypass any further testing and advance the sequence number, and P would not advance the sequence number, but rather, retest the same pin again.

If there were no mis-wires between the first and second end, the program routine, on FIG. 5F, will set up a value called T. T is a time value and the program will set it to zero, and then test for low ohmic continuity between the first and second end. Specifically, the program will measure the path between the two boxes and subtract the values of F and G, which were the resistances of the first and second multiplexer boxes, to obtain a new value of I. If I falls within a specific region of ohmic value it will be accepted, or if it does not fall within that value, there will be a retest. If the final value is acceptable (I is equal to 1) the program will delay one second. This delay is necessary because an operator may pull on the wire or otherwise not make a good connection, so it is necessary to repeat the test. After the second test, T is tested.

If T is not equal to 2, the program will increment T and again test the first end. This loop will be executed until T becomes equal to 2, in which case the program will sound the horn twice with a delay of one second to indicate to the operator that there is a proper connection. Now the system will advance to L, will increment the sequence number, and then fall through the same operations as before prior to going through the note and mis-wire routines.

Figure 5H:
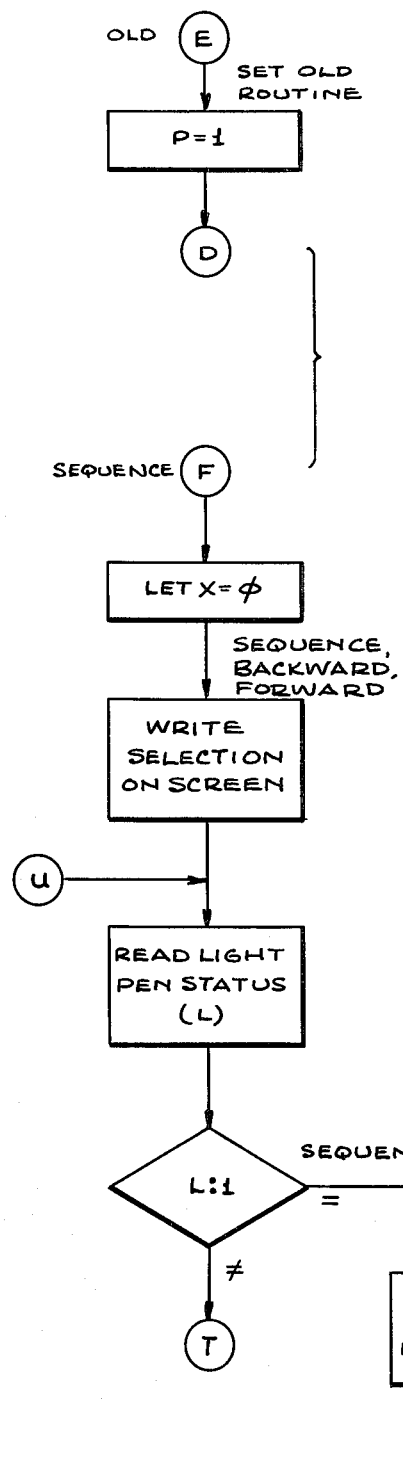
Figure 5G:
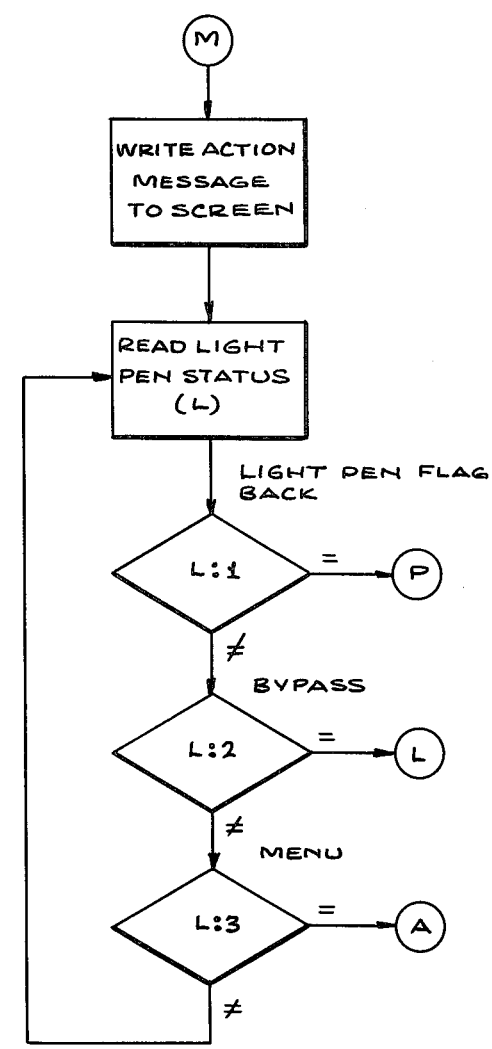

The OLD routine is represented by connector E of FIG. 5H. The OLD flag P is set to 1. This flag will be interpreted by the GO routine at connector D of FIG. 5D, resulting in the execution of a test which will fall through if it is a note. The OLD flag will be checked and if it is a note, the program will automatically sequence through the loop. If the value is not equal to N, in other words there is no note but it is true wired information, then the program will fall through to connector S of FIG. 5E where it will test for continuity. If that continuity exists, the program goes to connector R of FIG. 5F in a loop to continue to increment the sequence number until the first open sequence occurs. When the first open sequence occurs the program will stop and present the information on the screen.

The next routine, SEQUENCE at F of FIG. 5H, allows the operator to advance the program in terms of the actual sequence number to any sequence number that is specified by the light pen. Once the sequence number has been obtained, the program will go back with that sequence number and enter through connector P into the GO routine of FIG. 5D to present all the information of the wire data base to the GO routine. If, on the other hand, L is not equal to 1 then SEQUENCE has not been selected.

Figure 5I:
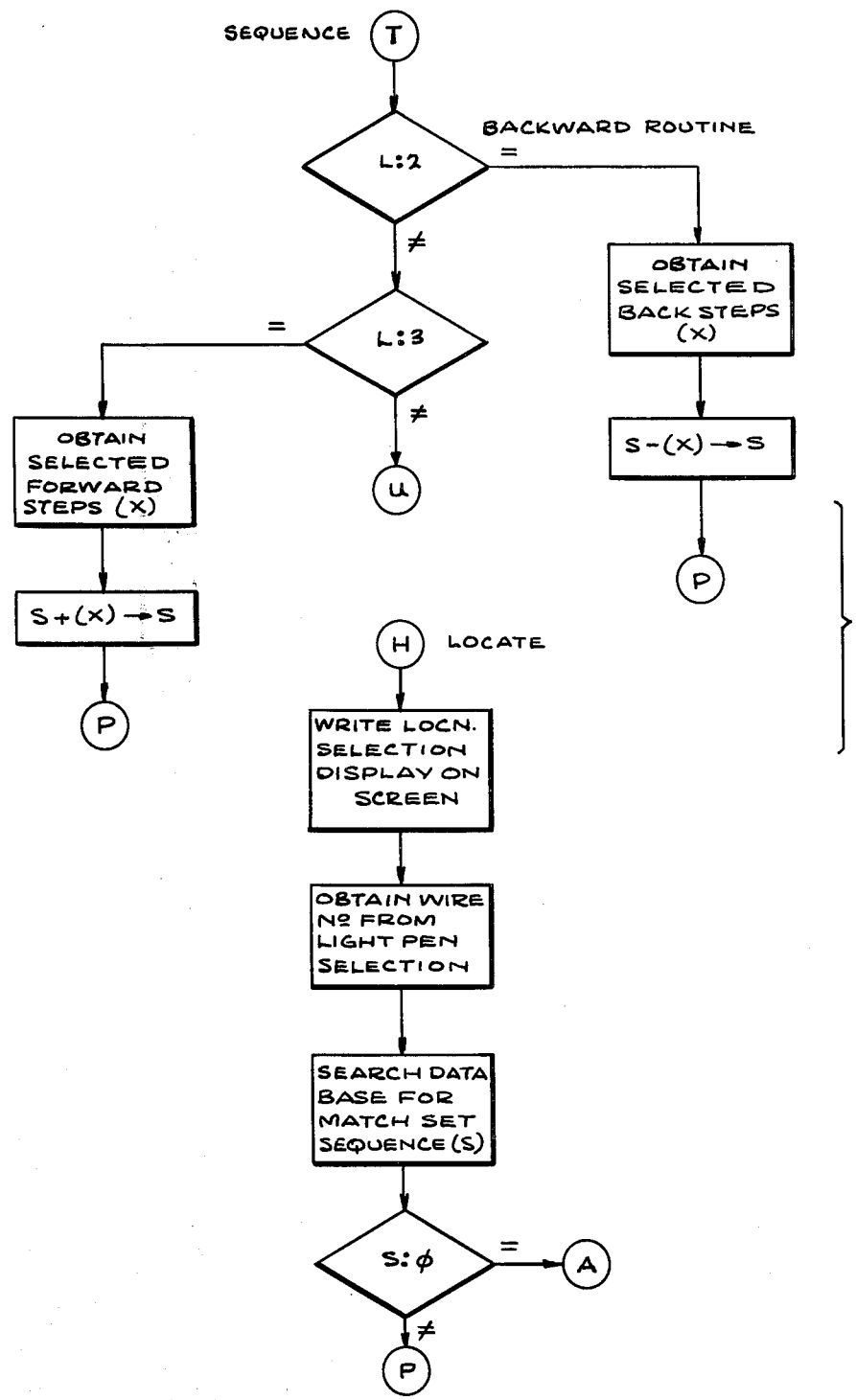

This SEQUENCE routine of FIGS. 5H and 5I automatically finds a sequence value, as manipulated by the light pen of the operator. If L is equal to 1 the light pen has found the sequence flag which indicates that the operator desires to select his own sequence and the program displays that particular sequence. If L, however, is equal to 2, the program will branch to connector T of FIG. 5I, the "backward" routine. This flag indicates that the operator wishes to go backward through the wire list. The program will obtain the selected number of backward steps, X, and subtract that from the current sequence number, S, to derive a new sequence number. The program then branches to connector P of FIG. 5D, the GO routine, inserting that sequence number back into GO routine and again executing the entire loop of the GO routine to display the information the operator had desire.

If, as shown in FIG. 5I, the operator selects light pen selection number 3, a forward step indication, the program will ask the operator for a new value of X, X being the number of forward steps which will be added to the present sequence number to derive a new sequence number. The program then returns through connector P to the GO routine, which, in turn, displays that new sequence as derived.

Next is the LOCATE routine at H of FIG. 5I which generates a presentation on the screen to allow the operator to specify a wire number by use of the light pen. This is done in the same fashion that forward step, backward sequence, etc. had been obtained. There is a search of the data base for a matching set of sequence numbers or wire numbers. Once the wire numbers have been matched to the data base, the actual sequence number is derived therefrom. In this particular instance, once derived, if the sequence does not fall within the bounds of the known data base the program will go back immediately to the menu. If, however, it is within bounds, the program will fall through to connector P of FIG. 5I to GO which will, in turn, display that located information.

Figure 5J:
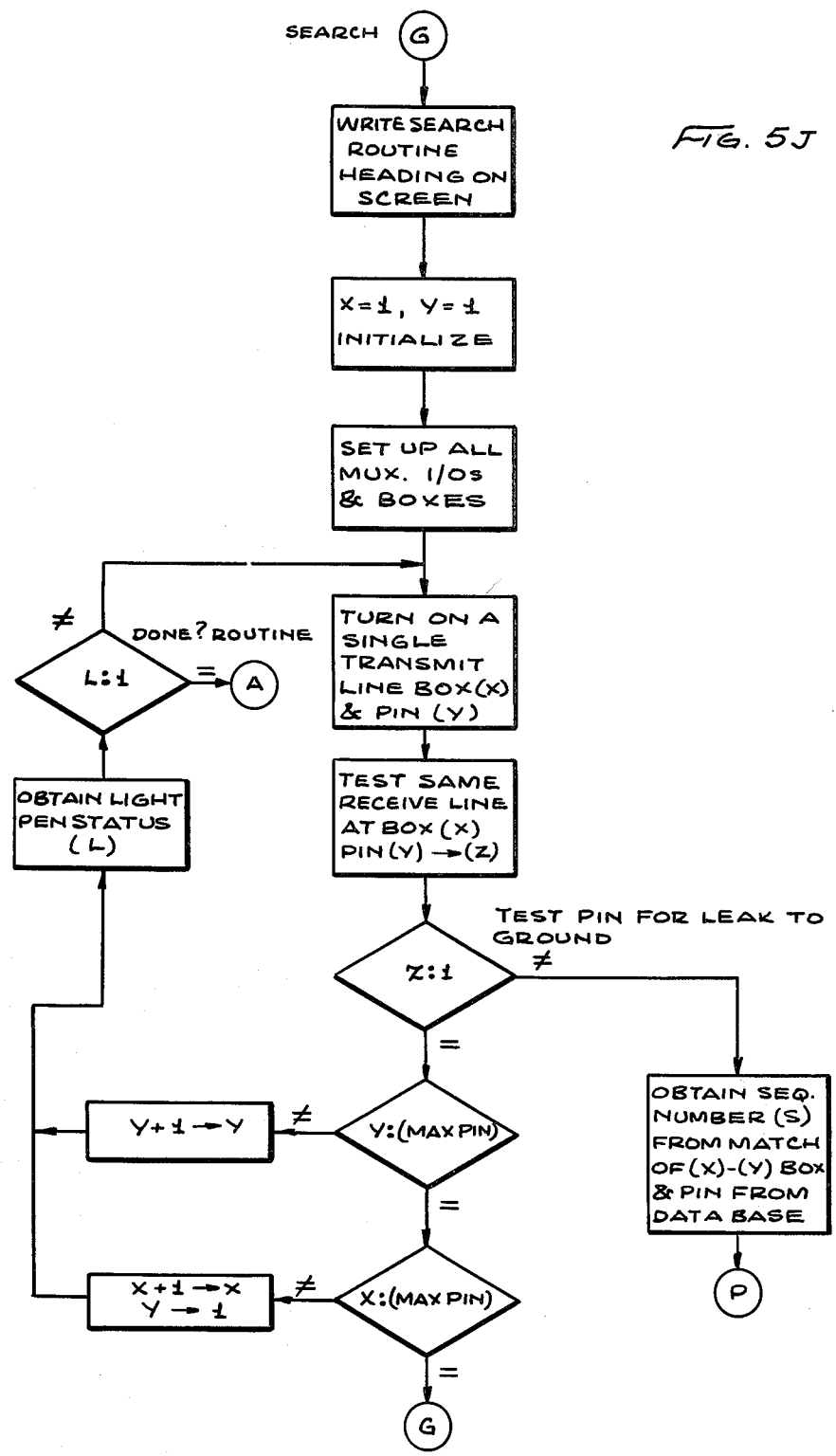

Next is the SEARCH routine at G of FIG. 5J which presents a heading on the screen. Two values, X and Y, and the multiplexer I/O routines are initialized. The program will then set a particular line in the first transmit box, first pin, as designated by X and Y, and will try to receive by means of the common receive channel, pins X and Y, to derive a value of Z from this reception. If Z is equal to 1, which means that the program received a full and complete signal to compare to the original signal sent out, the program will fall through, indicating that that particular pin has a good known value and has no leakages to ground or any return path to the multiplexer box. In this case the program will look at the value, Y, and compare it to the maximum number of pins for that particular box system. If the number of pins is not the maximum, the program will increment Y by 1, return and obtain a light pen status from the screen to find out if the operator has terminated prematurely for some reason. If the operator has prematurely terminated the operation, the program will go back to A of FIG. 5A which is the menu. If, on the other hand, the operator has not, the program will go back, turn on the same transmit line, box X, pin Y, test that line, except now the value has been increased by 1 on the pin, and then test the same value, increase by 1 at pin Y, to derive a new answer, Z. If Z is equal to the original amplitude of the pulse sent out, and Y has reached the maximum number of pins, the program will then go to SET to analyze box X. X is the number of boxes and is compared to the maximum number of boxes which are in the network. If this maximum number has not yet been reached, the program will increase the value of boxes, X, reduce the value of Y to 1, meaning that the routine will start at the next box, first pin, and go through the same routine as before, obtain the light status, checking to find out if the operator has prematurely terminated the test at that time, and test the new box, first pin. The program will continue to loop until all boxes and all pins have been tested for a value of 1. The program then branches to G to start the entire routine over again, meaning that the operator has gone through all boxes that exist on the formboard and has found that all interconnections for all boxes are at a value of 1, in other words, that all pulses are good. If, on the other hand, the program obtains a value of Z that is not equal to 1, which means that there is some leakage to ground, the program will obtain a sequence number by matching the box X and pin Y to the data base, deducing that data base's sequence number and portraying that information back to the operator by going through connector P back to the GO routine.

Figure 5K:
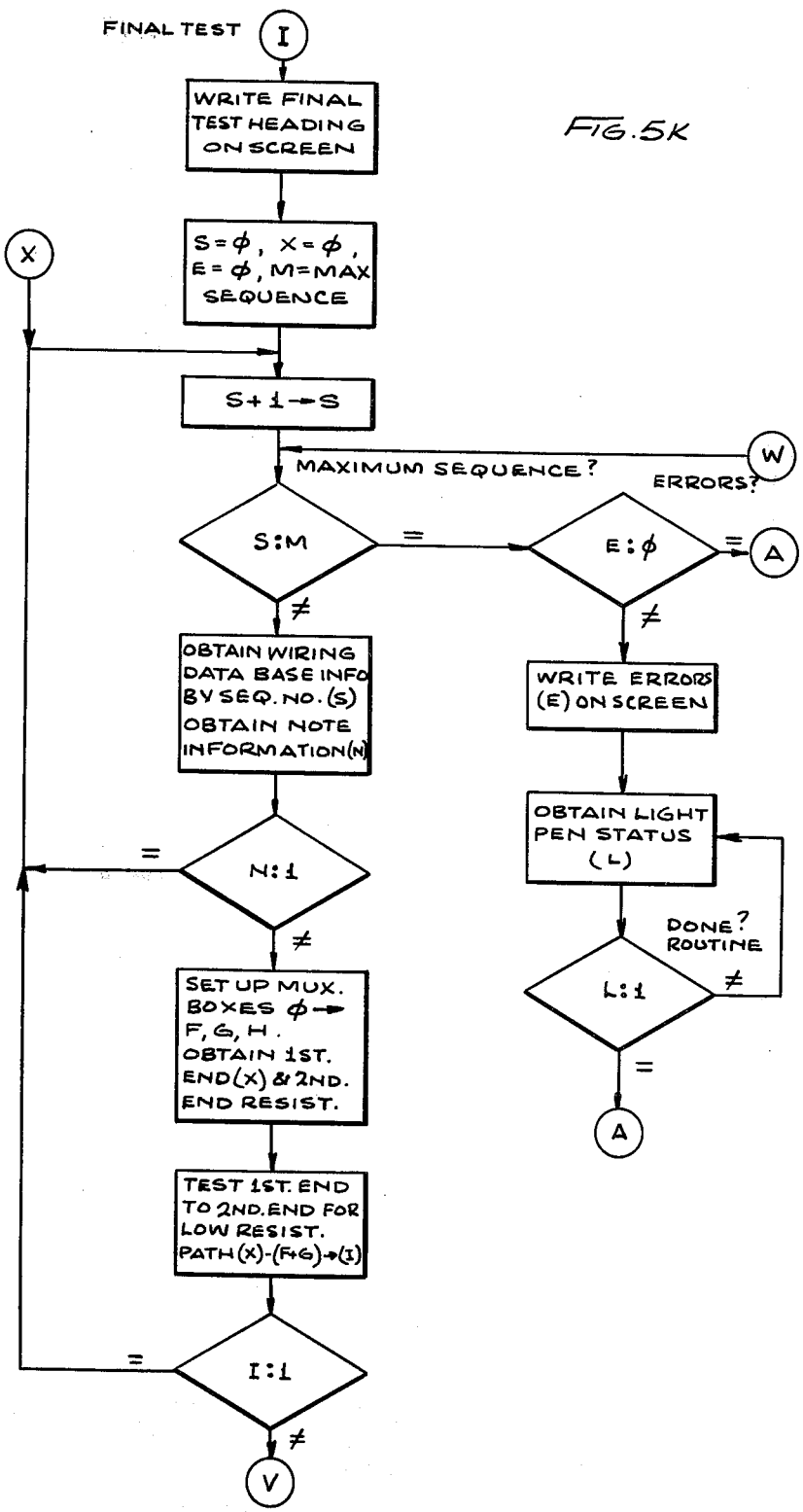

The FINAL TEST routine of FIG. 5K tells the operator that the program is in final test. Values X, S and E are zeroed and M is set equal to the maximum sequence number which is derived from the data base. S is then incremented and compared to the maximum sequence, M. If it is not equal, the program falls through and obtains the wiring data base information. If it is a note, the program will bypass it, then go back and increment the sequence number. It, on the other hand, it does contain viable test information the program will set up the multiplex boxes, again obtain first and second end resistance reading, and test the first and second end for an ohmic resistance path by computing the value I. If it is equal to 1 the program will loop back and increment the sequence number. Given correct ohmic paths, the program will loop until it reaches the maximum sequence number.

If I is not equal to 1, the V loop of FIG. 5L is taken. This loop will display the sequence number, the data base selection that has failed and the continuity test, and will also present on the screen several action blocks for the operator to select from. The first, when L is equal to 1, is a back routine where the operator can select to go backwards in final test to rerun the last test over, for instance, if there was some problem. If L is equal to 2, the bypass loop will set E to a value of 1. If L is equal to 3, the program will go back to the menu and present the new menu information.

If a maximum sequence value had been obtained on FIG. 5K, S would be equal to M. Then, if E is equal to zero, indicating that there were no errors, the program branches to the menu, but if E is not equal to zero, then the program will write the errors on the screen, and also write a question mark on the screen to indicate to the operator that errors exist in the final test routine. Then the program branches back to the menu again.

The last routine, shown in FIG. 5M, is SELF-TEST and will present a heading on the screen and set X and Y to 1, the value of M to maximum boxes and N to maximum pins. Here the object is to test all the boxes that exist within the network on the formboard. This is done prior to initiating any sort of wiring action on the formboard itself. The program proceeds from connector J, writing this information on the screen, setting up the multiplexer I/O's, and enabling a single box and single pin within that box. This test will determine the resistance of the particular pin and box from the transmit side to the receive side, and derive a value, Z, which, if equal to 1, means that the initial pulse sent out is equal to the pulse received back from that same interconnected pin. If Z equals 1, the program falls through and asks if it has reached a maximum number of pins. If not, the program will increase the maximum number of pins by one, and again return. If the program has reached the maximum number of pins, it will ask if the boxes have reached the maximum value. If the boxes have not reached the maximum value, Y will be set equal to 0 and the number of box X set to X plus 1 to derive a series of new values of X until all boxes have been tested. If all boxes have been tested, the self-test routine is complete and the program goes back to the menu. If, on the other hand, an error is found, the program will write the error box and pin numbers on the screen and also display a "done" box indication for the operator to observe, to indicate that the error has occurred. The operator then may make a selection to go back to menu after the error box has been removed from the formboard.

Pursuant to the requirements of the patent statutes, the principle of this invention has been explained and exemplified in a manner so that it can be readily practiced by those skilled in the art to which it pertains, or with which it is most nearly connected, such exemplification including what is presently considered to represent the best embodiment of the invention. However, it should be clearly understood that the above description and illustrations are not intended to unduly limit the scope of the appended claims, but that therefrom the invention may be practiced otherwise than as specifically described and exemplified herein, by those skilled in the art, and having the benefit of this disclosure.

INDUSTRIAL APPLICATION

The computerized system is useful in the fabrication and testing of wire harnesses.

I claim:

1. A computerized test system for testing a harness comprising a plurality of connectors, each having a plurality of pins thereon, and connecting wires, said system comprising:
   a computer for transmitting a test pulse of known electrical characteristics,
   a plurality of transponders, each coupled to one of said connectors, each transponder coupled to said computer and under control of said computer for the coupling of said transmitted pulse to a first selected pin of a first selected connector, and for the coupling of a received pulse from a second selected pin of a second selected connector to said computer, said computer acting to select said first and second pins and connectors, and
   means under control of said computer for receiving said test pulse, for measuring the electrical characteristics of said received test pulse, said electrical characteristics being representative of the resistance of the path taken by said pulse, and for communicating the measurement of said electrical characteristics to said computer,
   whereby said computer operates to determine from said measurement the resistance of the path taken by said test pulse from said first selected pin through a connecting harness wire to said second selected pin to test said harness.

2. The system of claim 1 further comprising:
   a connecting cable for coupling said computer and said plurality of transponders, said transponders being coupled in parallel, and wherein each transponder further comprises
   a transmitter multiplexer means for coupling said transmitted test pulse from said computer to any pin of its associated connector and a receiver multiplexer means for coupling said received test pulse from any pin of its associated connector to said computer.

3. The system of claim 2 wherein each transmitter and receiver multiplexer means is addressed by said computer through said cable to select said first selected connector pin for coupling the transmitted test pulse from said computer or to select said second selected connector pin for coupling the received test pulse to said computer.

4. The system of claim 3 wherein each transmitter and receiver means comprises a plurality of multiplexer devices, each addressed by said computer, and wherein said transponder further comprises
   a decoder under computer control for selecting one multiplexer device in each of said multiplexer means.

5. The system of claim 4 wherein each transponder further comprises an auto-coding circuit, said auto-coding circuit comprising:
   means for receiving from said computer and for storing a unique transponder address for identifying each transponder, means for comparing said stored address to an instant address coupled from said computer and for enabling said transponder if the stored and instant addresses are identical, and wherein said computer further contains means for transmitting to all transponders in parallel through said cable,
  (a) an address which enables one transponder to couple the test pulse from said computer to one selected transmitter multiplexer device,
  (b) an address which enables the selected transmitter multiplexer device to select one connector pin to couple said transmitted test pulse,
  (c) an address which enables one receiver multiplexer device of one selected transponder, and
  (d) an address which enables the selected receiver multiplexer device to select one connector pin to couple said received test pulse to said computer.

6. The system of claim 2 further comprising means for computing the resistance of said harness by measuring the total resistance of the circuit through which said test pulse is coupled, said total resistance comprising said transmitter and receiver multiplexer means resistance and said harness resistance, measuring the resistance of each multiplexer means in said circuit, and subtracting the multiplexer means resistance from the total resistance to find the harness resistance.

7. A computerized fabrication and test system for use by an operator for producing a harness comprising a plurality of connectors and connecting wires, said system comprising:
  a formboard on which said harness is fabricated and tested,
  means on said formboard for indicating the positions of the harness wires and connectors on said formboard,
  identification means for identifying to said operator a wire designated to be installed in said harness, and the specific connector pins on which the ends of said wire are to be terminated,
  a computer for transmitting to said identification means the identification of said wire, and its associated connector pins, to be installed in said harness and for transmitting a test pulse of known characteristics,
  means under control of said computer for receiving said test pulse, for measuring the electrical characteristics of said received test pulse, said electrical characteristics being representative of the resistance of the path taken by said pulse, and for communicating the measurement of said electrical characteristics to said computer, and
  a plurality of transponders, each coupled to one of said connectors, under computer control, for selective coupling of said transmitted pulse to a first selected pin of a first selected connector, and for the coupling of said received pulse from a second selected pin of a second selected connector to said computer to enable said computer to determine the resistance of the path taken by said test pulse.

8. The system of claim 7 further comprising:
  a connecting cable for coupling said computer, said identification means and said plurality of transponders, said transponders being coupled in parallel, and wherein
  each transponder further comprises transmitter multiplexer means and receiver multiplexer means, each multiplexer means comprising a pin coupled to each associated connector pin and a common pin connected to a wire of said cable for coupling the test pulse from said computer through said cable and transmitter multiplexer means to a connector pin or from a connector pin through said receiver multiplexer means and cable to said computer.

9. The system of claim 8 wherein each transmitter and receiver multiplexer means is addressed by said computer through said cable to select said first selected connector pin for coupling the transmitted test pulse from said computer or to select said second selected connector pin for coupling the received test pulse to said computer.

10. The system of claim 9 wherein each transmitter and receiver multiplexer means comprises a plurality of multiplexer devices, each addressed by said computer, and
  wherein said transponder further comprises a decoder under computer control for selecting one multiplexer device in each of said multiplexer means.

11. The system of claim 10 wherein each transponder further comprises an auto-coding circuit, said auto-coding circuit comprising:
  means for receiving from said computer and for storing a unique transponder address for identifying each transponder,
  means for comparing said stored address to an instant address coupled from said computer and for enabling said transponder if the stored and instant addresses are identical, and
  wherein said computer further contains means for transmitting to all transponders in parallel through said cable,
    (a) an address which enables one transponder to couple the test pulse from said computer to one selected transmitter multiplexer device,
    (b) an address which enables the selected transmitter multiplexer device to select one connector pin to couple said transmitted test pulse,
    (c) an address which enables one receiver multiplexer device of one selected transponder, and
    (d) an address which enables the selected receiver multiplexer device to select one connector pin to couple said received test pulse to said computer.

12. The system of claim 8 further comprising means for computing the resistance of the circuit through which said test pulse is coupled, said total resistance comprising said transmitter and receiver multiplexer means resistance and said harness resistance, measuring the resistance of each multiplexer means in said circuit, and subtracting the multiplexer means resistance from the total resistance to find the harness resistance.

13. The apparatus of claim 7 wherein said identification means is a visual display.

14. The apparatus of claim 13 wherein said visual display is a television monitor.

15. The method of testing a harness comprising a plurality of connectors and connecting wires, each wire connecting a first pin of a first connector and a second pin of a second connector, said method comprising the steps of:
  generating a test pulse of known electrical characteristics,
  transmitting said test pulse through a transmitter multiplexer to said first pin of said first connector, coupling said test pulse from said first pin through the associated connecting wire to said second pin of said second connector, coupling said test pulse through a receiver multiplexer to a computer, using said computer to determine the electrical characteristics of said received test pulse to determine the total resistance of the path taken by said test pulse.

16. The method of claim 15 wherein said step of using said computer comprises the steps of:

computing the resistance of said transmitter multiplexer, computing the resistance of said receiver multiplexer resistances from said total path resistance to calculate the harness resistance between said first and second pins.

17. The method of claim 16 wherein pairs of said transmitter and receiver multiplexers are included in transponders and comprising the further step of using said computer to store in each of said transponders a unique address so that identical transponders may be independently addressed by said computer.

18. The method of fabricating and testing a harness comprising a plurality of connectors and connecting wires, said method comprising the steps of indicating a first pin of a first connector and a second pin of a second connector to be connected by a designated wire, providing a formboard to indicate the position of said connectors and the path of said wire to be connected therebetween, connecting said connector pins with said wire, said wire being positioned along the indicated path, generating a test pulse of known electrical characteristics, transmitting said test pulse through a transmitter multiplexer to said first pin of said first connector, coupling said test pulse from said first pin through the associated connecting wire to said second pin of said second connector, coupling said test pulse through a receiver multiplexer to a computer, using said computer to determine the electrical characteristics of said received test pulse to determine the total resistance of the path taken by said test pulse.

19. The method of claim 18 wherein said step of using said computer comprises the steps of computing the resistance of said transmitter multiplexer, computing the resistance of said receiver multiplexer, and subtracting said transmitter and receiver multiplexer resistances from said total path resistance to calculate the harness resistance between said first and second pins.

20. The method of claim 19 wherein pairs of said transmitter and receiver multiplexers are included in transponders and comprising the further step of using said computer to store into each of said transponders a unique address so that identical transponders may be independently addressed by said computer.

* * * * *